(12) United States Patent
Lüdemann et al.

(10) Patent No.: US 6,423,567 B1
(45) Date of Patent: Jul. 23, 2002

(54) METHOD FOR PRODUCING CONTACT STRUCTURES IN SOLAR CELLS

(75) Inventors: Ralf Lüdemann; Sebastian Schaefer, both of Freiburg (DE)

(73) Assignee: Fraunhofer Gesellschaft zur forderung der angewandten Forschung e.V., Munchen (DE)

( * ) Notice: Subject to any disclaimer, the term of this patent is extended or adjusted under 35 U.S.C. 154(b) by 0 days.

(21) Appl. No.: 09/674,176
(22) PCT Filed: Apr. 27, 1999
(86) PCT No.: PCT/DE99/01246
§ 371 (c)(1),
(2), (4) Date: Jan. 16, 2001
(87) PCT Pub. No.: WO99/56324
PCT Pub. Date: Nov. 4, 1999

(30) Foreign Application Priority Data

Apr. 29, 1998 (DE) .......................................... 198 19 200

(51) Int. Cl.[7] .............................................. H01L 21/00
(52) U.S. Cl. .......................................... 438/83; 438/98
(58) Field of Search ............................. 438/57, 64, 66, 438/706, 714, 83, 98; 136/244, 246, 255, 259

(56) References Cited

U.S. PATENT DOCUMENTS 4,836,861 A * 6/1989 Peltzer et al. ............... 136/244

FOREIGN PATENT DOCUMENTS

| DE | 196 15 663 A1 | 1/1997 |
|---|---|---|
| DE | 196 21 487 A1 | 12/1997 |
| WO | WO 88/03709 A1 | 5/1988 |
| WO | WO 96/01494 A1 | 1/1996 |

* cited by examiner

Primary Examiner—Craig Thompson
(74) Attorney, Agent, or Firm—Breiner & Breiner, L.L.C.

(57) ABSTRACT

The present invention relates to a process for the fabrication of contact structures in semiconductor components, in particular, solar cells, such as semiconductor components having such contact structures.

According to one aspect of the present invention, after positioning of an etching mask (3) over a first layer respectively sequence of layers (2), indentations are etched through the first layer down to or into a second layer (1) lying therebelow. The etching occurs in such a manner that the etching mask (3) is undercut and/or at least one region of the first layer (2) contains negative flanks. Subsequently an electrically conductive material (9) is introduced into the indentations, with the etching mask (3) or the first layer (2) forming a shadow mask for the introduction of this material. This conductive material is only introduced to a height in the indentations at which there is no contact between the conductive material (9) and the first layer (2).

These structures permit, for the first time, contacting the base through the emitter without additional masking. The present invention permits thereby simpler fabrication and more cost effective fabrication of metal contacts on solar cells.

9 Claims, 4 Drawing Sheets

METHOD FOR PRODUCING CONTACT STRUCTURES IN SOLAR CELLS

The present invention relates to a process for the fabrication of contact structures in solar cells as well as solar cells having such contact structures. The present invention relates, in particular, to structures of grooves or holes and a process for their realization, which permits novel contacting of solar cells.

Solar cells are components which convert light into electric energy. Usually they are made of semiconductor material containing regions respectively layers of varying mobility for positive and negative charge carriers, n-type conductivity respectively p-type conductivity regions.

These regions are referred to as the emitter respectively as the base. The positive and negative charge carriers generated by incident light are separated and can be carried away by the metal contacts provided on the respective regions. Only those charge carriers contribute to the usual electric power of the solar cells which reach the contacts and which do not recombine with a respective other charge carrier.

The metal contacts are usually fabricated by means of vapor depositing metal, which is subsequently thickened by means of electroplating, by precipitating nickel without current or by pressing a metal paste onto the surface of the to-be-contacted regions. If these regions do not cover the entire solar cell surface or the metal can, for other reasons, only be deposited at certain points (e.g. shading of the light, increased recombination at the contact, etc.), as shall be described below, this is ensured by employing masks during fabrication.

Figure 1A:
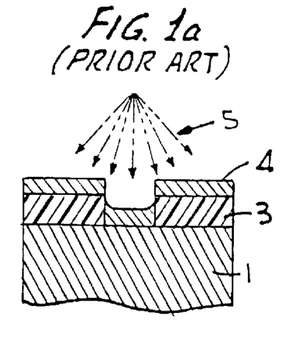

In vapor depositing metals, Usually a photolithographically produced varnished mask (3) is deposited directly onto the surface of the to-be-contacted layer (1), as is shown in FIG. 1a. Then a metal layer (4) is precipitated from the metal vapor (5) onto the entire surface and the varnished mask is removed.

Figure 1B:
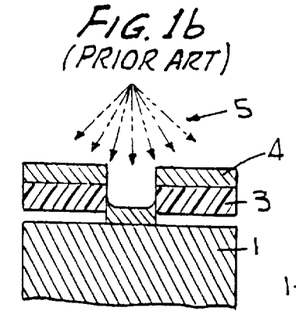
Figure 1C:
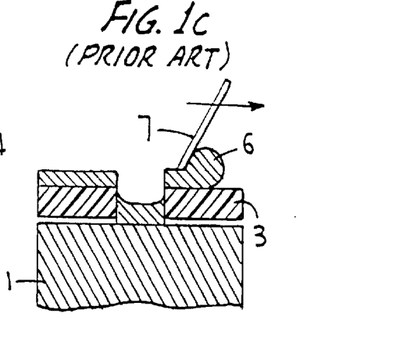

Another possible method of structuring comprises placing respectively clamping on a shadow mask (3), as shown in FIG. 1b. The other process steps occur as described in connection with FIG. 1a. Pressure processes are also employed to apply vapor-deposited metal. Here too masks, for instance screen printing masks (3) or pre-formed blocks (stamp print or tampon print), are used. FIG. 1c shows the screen printing process in which the metal is pressed in the form of a metal paste into the intermediate spaces of the mask with a squeegee (7).

The metal contacts produced using the above-described process are usually realized in a comb-like shape, i.e. they form so-called grids.

Figure 2:
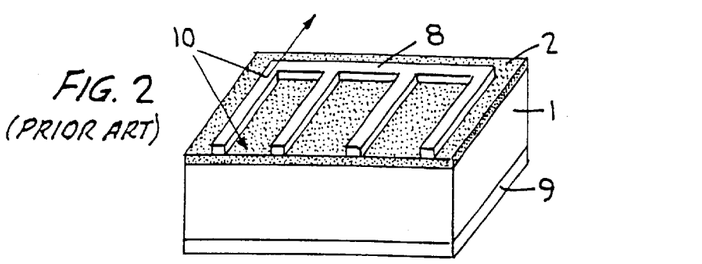

In their simplest form, solar cells comprise whole-surface base and emitter regions, with the emitter usually lying on the light-facing side (front side) (see FIG. 2). In this manner, the base can be contacted by placing the metal full surface on the rear side. The emitter is contacted with a grid, with the goal of losing as little as possible light for the solar cell owing to reflection at the metal contact. This is referred to as the contacting shading the solar cell. The less shading, i.e. the more light being able to reach into the solar cell, the greater the current exploited per cell per surface and thus the greater the efficiency. In order to ensure the transport of current with little resistance, the spacing between the grid finger must be selected not too large, the number and cross section not too small. Thus, a certain amount of shading must be taken into account.

FIG. 2 shows a solar cell with a base layer (1), an emitter layer (2) and an emitter grid (8) for contacting the emitter. The front side, on which the light falls (10), is formed by the emitter layer (2). The base contact (9) is deposited full surface on the rear side of the base layer (1).

WO 88/03709 describes such a solar cell. In this solar cell, the emitter layer is contacted via grooves that are for their part in contact with a grid which is deposited on the surface of the solar cell. In this solar cell, the grooves are produced by means of an etching process. However, due to the arrangement and the shape of the grid, here too undesired shading of the solar cell surface has to be taken into account.

One way to reduce shading by the metal contacts is to design the grid fingers tall and narrow as proposed by S. W. Glunz et al., in Optimized High-Efficiency Silicon Solar Cells with $J_{sc}$=42 mA/cm$^2$ and $\eta$=23.3%, 14$^{th}$ EU-PVSEC Barcelona, Spain (1997), which decreases the solar cells surface covered by the contacts without reducing the cross section and therewith the conductivity of the grid.

However, the process requires a special varnished mask which ensures that the grid only grows in height during thickening of the vapor deposited metal by means of electroplating. According to the present state of the art, pressing on such fine contacts is not possible.

U.S. Pat. No. 4,726,850 presents another idea, the so-called "buried contact cell", which is based on laser-produced grooves (also see U.S. Pat. No. 4,626,613), which are filled with metal. Shading of the solar cells is determined by the width of the grooves and can be minimized, whereas the cross section of the contacts is retained by the depth of the grooves. Another advantage of such buried contacts is the larger contact surface between the metal and the solar cell, which lowers contact resistance.

However, a drawback of this process is that using lasers to produce the grooves is a very complicated process. The laser beam has to be led by a precise deflection or guiding device over the entire surface of the solar cell. Moreover, the laser beam damages the solar cell thus the grooves have to subsequently be etched to remove the damaged layer. This also applies to mechanically produced, for example sawed, grooves.

In addition to increasing efficiency, simplifying production and developing cheaper basic materials are the most important challenges facing solar cell technology. Regarding contacting, obviation of masks represents considerable simplification in metallization. Two briefly described processes for producing grids without using masks are based on texturing the surface by means of sawed grooves similar to a saw-toothed pattern.

Figure 3A:
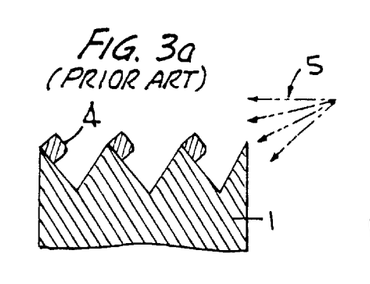

Therefore, a first process in which only the tips of the "saw teeth" are metallized by means of oblique vapor depositing due to mutual shading is proposed by M. Verbeek et al. in Mechanically Grooved High-Efficiency Silicon Solar Cells with Self-Aligned Metallization, 25$^{th}$ IEEE-PVSC Washington, U.S.A (1996). A diagram of this is shown in FIG. 3a. The figure depicts the sawed surface of a to-be-contacted layer (1), on whose tips metallization (4) occurs only on one side by means of oblique vapor depositing (5).

Figure 3B:
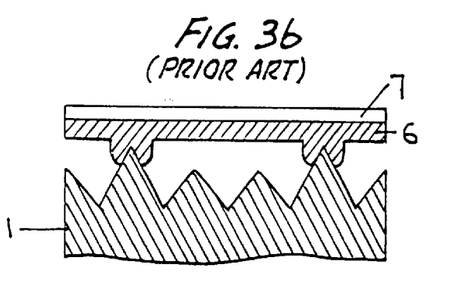
Figure 4A:
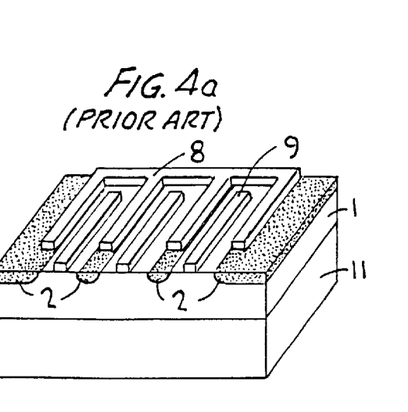
Figure 4B:
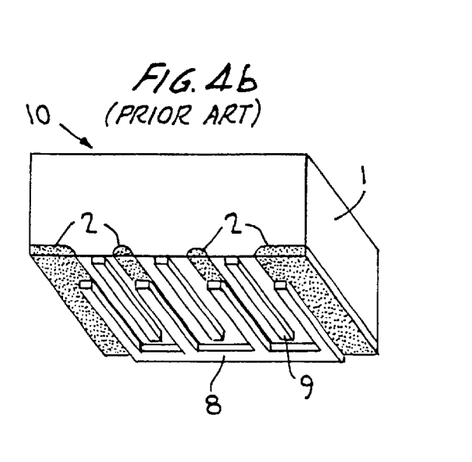
Figures 5A, 5B, 5C, 5D:
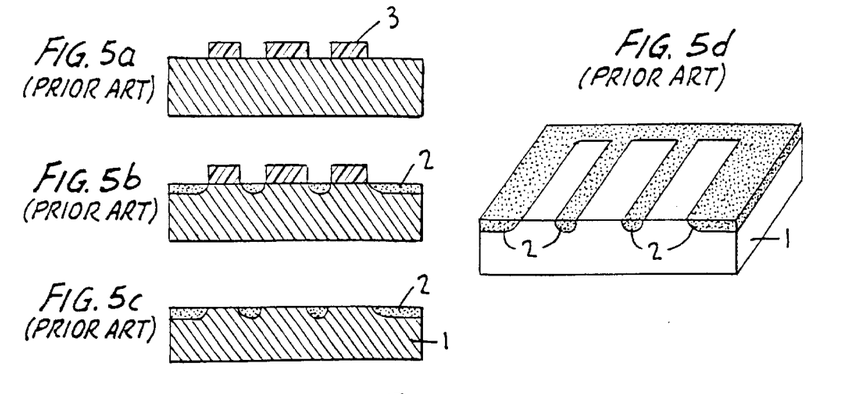

A second process is described by C. Gerhards et al., in Mechanically V-Textured Low Cost Multicrystalline Silicon Solar Cells with a Novel Printing Metallization , 26$^{th}$ IEEE-PVSC Anaheim, U.S.A. (1997). By producing "saw teeth" of varying height, this process permits selective metallization by means of so-called "roller printing", in which a metal paste (6) is applied with a squeegee (7), as shown in FIG. 3b.

However, in both processes an approximately 3–5 $\mu$m thick damaged layer has to be removed after sawing by means of etching. Moreover, these two processes are not suited for sensitive materials, such as for instance some band-drawn materials or thin precipitated layers due to the mechanical tension occurring during sawing. They are also unsuited for thin-layer solar cells, because the minimal achievable saw-depths are usually greater than the thickness of the active solar cell layers (3–50 µm).

In the course of developing cheaper basic materials, the idea of thin-layer solar cells on a cost-favorable substrate gains special significance. The solar cell comprises only a thin semiconductor layer (3–50 µm) applied Barcelona, Spain (1997), pp. 392–395, which decreases the solar cells surface covered by the contacts without reducing the cross section and therewith the conductivity of the grid.

However, the process requires a special varnished mask which ensures that the grid only grows in height during thickening of the vapor deposited metal by means of electroplating. According to the present state of the art, pressing on such fine contacts is not possible.

U.S. Pat. No. 4,726,850 presents another idea, the so-called "buried contact cell", which is based on laser-produced grooves (also see U.S. Pat. No. 4,626,613), which are filled with metal. Shading of the solar cells is determined by the width of the grooves and can be minimized, whereas the cross section of the contacts is retained by the depth of the grooves.

Another advantage of such buried contacts is the larger contact surface between the metal and the solar cell, which lowers contact resistance.

However, a drawback of this process is that using lasers to produce the grooves is a very complicated process. The laser beam has to be led by a precise deflection or guiding device over the entire surface of the solar cell. Moreover, the laser beam damages the solar cell thus the grooves have to subsequently be etched to remove the damaged layer. This also applies to mechanically produced, for example sawed, grooves.

The publication by C. M. Chong, et al., Plasma-Grooved, Buried Silicon Solar Cells, Journal of Appl. Phys. 69(1991), No. 7, pp. 4135–4136, also describes solar cells with buried contacts in the emitter layer, where there is less shading of the surface due to contacting compared to other solar cells. The base is contacted from the rear side of the solar cell via full-surface-applied metallization. Producing the grooves occurs by reactive sputter etching.

In addition to increasing efficiency, simplifying production and developing cheaper basic materials are the most important challenges facing solar cell technology. Regarding contacting, obviation of masks represents considerable simplification in metallization. Two briefly described processes for producing grids without using masks are based on texturing the surface by means of sawed grooves similar to a saw-toothed pattern.

Therefore, a first process in which only the tips of the "saw teeth" are metallized by means of oblique vapor depositing due to mutual shading is proposed by M. Verbeek et al. in Mechanically Grooved High-Efficiency Silicon Solar Cells with Self-Aligned Metallization, $25^{th}$ IEEE-PVSC Washington, U.S.A (1996). A diagram of this is shown in FIG. 3a. The figure depicts the sawed surface of a to-be-contacted layer (1), on whose tips metallization (4) occurs only on one side by means of oblique vapor depositing (5).

Furthermore, the process should permit simple realization of solar cells with one-sided contact solar cells and rear-side contact solar cells.

This object is solved by means of the process according to claims 1 and 2 respectively by means of the solar cell according to claim 11 Advantageous embodiments are the subject matter of the subclaims.

According to one aspect of the present invention (claim 1), after positioning of the etching mask on the first layer or first sequence of layers, indentations are etched through the first layer or first sequence of layers down to or into the second layer below. An element of the present invention is that the etching occurs in such a manner that the etching mask is undercut. Then electrically conductive material is introduced in the indentations, with the etching mask forming a shadow mask for introducing the material owing to the indercutting and the yielded projecting edges. The conductive material is introduced only in such a manner respectively to such a height in the indentations that no contact is created between the conductive material and the first layer or first sequence of layers. Subsequently the etching mask is removed.

According to a second aspect of the present invention (claim 2), the first step is carried out like in the process according to claim 1. However, according to the second aspect of the present invention, etching the indentations is carried out in such a manner that at least one region of the first layer or first sequence of layers obtains negative flanks respectively is undercut. After the etching step, the etching mask can be already be removed. Then the electrically conductive material is introduced into the indentations. In this instance, the region with the first layer or first sequence of layers with the negative flanks forms a shadow mask for introducing the material owing to the yielded projecting edges. The conductive material is also only introduced in such a manner respectively to such a height in the indentations that no contact occurs between the conductive material and the first layer or first sequence of layers.

The particularly advantageous aspects of the invented process according to claims 1 and 2 permit realizing contacting the second layer through the first layer without additional masking or isolation, permitting contacting a base layer through the emitter layer of a solar cell.

With this process, any desired pattern, such as grooves or holes and combinations of grooves and holes can be realized in one step.

By using this process, no significant damage occurs to the solar cell and the to-be-treated material is not subject to mechanical stress.

In the invented process of claims 1 and 2, for example, photolithographically structured varnish layers can be employed as etching masks. Oxide, nitride or metal layers can also be used as etching masks. Especially advantageous of this process is being able to use shadow masks that are only placed or clamped on thereby obviating an additional masking step.

Introducing the electrically conductive material can occur using processes known in the art, such as for example the processes described in the introduction of the specification in connection with FIG. 1.

An invented solar cell provided with a contact structure according to claim 2 has indentations or openings in the first layer or first sequence of layers extending down to or into the second layer or first sequence of layers. The indentations have at least in the region of the first layer or first sequence of layers oblique flanks whose intermediate spaces increase with depth (negative flanks). In the indentations, the electrically conductive material is introduced only in such a manner respectively in such a height so that there is no contact between the conductive material and the first layer or first sequence of layers.

Oblique flanks refers to both straight and curved flanks, in other words any flank shape deviating from a vertical one (perpendicular to the surface of the solar cell respectively the first layer or etching mask). Of course, this also includes steps in the flanks, horizontal regions which lead to enlarging the cross section of the indentation with depth, as oblique respectively negative flanks in the present sense.

The invented process is an improvement of contact structures respectively contacting processes for solar cells known in the art. The heart of the process according to claims 1 and 2 is specially shaped indentations. The described etching processes are preferably realized using a plasma etching process (cf. claim 8).

Figure 6:
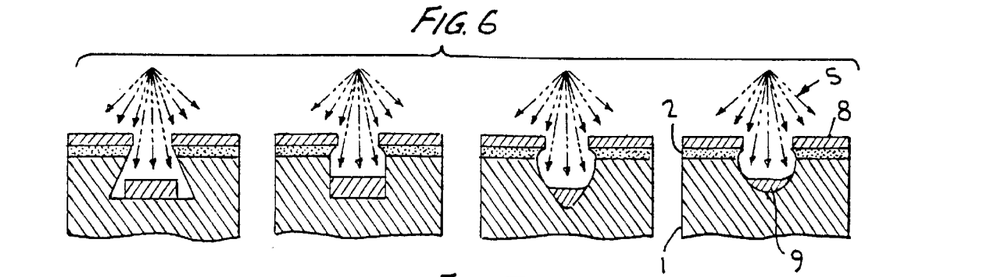

The indentations in the form of grooves or holes are distinguished in that they partly act self-masking due to their selective undercutting respectively flank shape (cf. FIG. 6, claim 2). This form of indentations can also be realized by selective control of the etching process or also by varying etching behavior of the materials in the different surface layers. Due to the selective (self) masking, some parts of the structure are not metallized during vapor depositing, thus short-circuiting between the emitter and the base is prevented during metallization.

Therefore, for the first time a contact structure is feasible in which the base of a solar cell can be contacted from the emitter side following homogeneous diffusion of the emitter.

Figure 7:
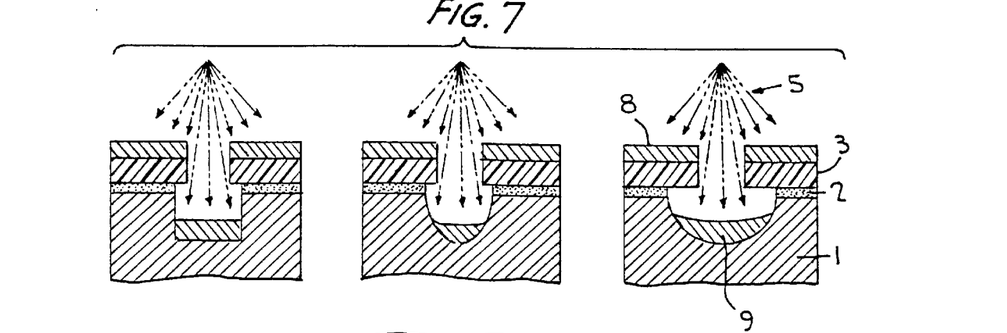

Apart from selective shaping of the indentation, this self-masking effect can also be obtained by etching processes which do not attack the mask needed for creating the structure thus undercut it in such a manner that the mask partly masks the flanks of the indentations during metallization (cf. FIG. 7, claim 1). As the same mask is employed for creating the structure and for metallization, these are so-called self-aligning contact structures.

In order to minimize shading in solar cells and simultaneously ensure high current conductivity of the contacts and little contact resistance, the grooves or holes should be narrow and deep, i.e. possess a high aspect ratio (ratio of depth to width).

Creating the invented grooves or hole structures cannot be achieved by using lasers or by mechanical shaping. The structures can be realized to a limited extent, for instance, using wet chemical etching.

On the one hand, the property of some etching solutions can be utilized to etch more rapidly in certain crystal directions than in others. On suitably cut monocrystal material, this can result in the desired structures. However, their size and configuration is given by the crystal structure of the material.

On the other hand, etching solutions can be employed which etch equally fast in all crystal directions and undercut the etching mask but do not attack it. However, this purely isotropic etch removal only produces hemispherical structures, i.e. a poor aspect ratio.

Therefore, plasma processes, with which the incline of the flank or undercutting can be advantageously controlled, are preferably used.

In plasma etching, reactive and/or inert gases are triggered by means of high-frequency radiation and/or microwave radiation. The resulting radicals can react with the sample surface (isotropic chemical etching) and/or resulting ions are accelerated onto it by means of an electric field. In the case of the reactive ion etching (RIE), mainly reactive ions are used which not only eject surface atoms or support chemical reactions with their energy, but also can themselves react with the surface atoms. The directed ion flow results in anisotropic removal. Skillful selection of the process parameters permits influencing the relationship of isotropic and anisotropic etching and therefore undercutting respectively permits influencing the shape of the flanks of the structures. This can be used independent of the to-be-The exact placement of the respective metal contacts on the corresponding emitter region respectively base region is a critical alignment problem and call for additional masks.

DE 3919693 describes a solar cell with a projecting dielectric layer and a process for its fabrication. In the fabrication process, a dielectric layer is applied to the surface of the emitter layer of the solar cell and structured. Then, this dielectric layer is employed as an etching mask in order to etch grooves or indentations through the emitter layer into the base of the solar cell lying therebelow. This etching process is executed in such a manner that the dielectric etching mask is undercut. Then the metal is introduced into the created indentation, with the projecting area of the dielectric layer serving as a shadow mask. The metal is introduced only to a level in the indentations at which no contact to the emitter layer is created. In this manner contacting of the base layer of a solar cell is realized through the emitter layer. In the process of this publication, the dielectric layer is subsequently not removed, but if need be only etched back to the desired thickness at which it fulfills the function of an antireflection coating. As a result of this process, a solar cell with a projecting dielectric layer is yielded, whose base is contacted through the emitter layer via V-shaped indentations.

It is the object of the present invention to provide a process for producing contact structures in solar cells as well as solar cells having contact structures, which can be realized in a simple and inexpensive manner.

Furthermore, the process should permit simple realization of solar cells with one-sided contact solar cells and rear-side contact solar cells.

This object is solved by means of the process according to claims 1 and 2 respectively by means of the solar cell according to claim 11. Advantageous embodiments are the subject matter of the subclaims.

According to one aspect of the present invention (claim 1), after positioning of the etching mask on the first layer or first sequence of layers, indentations are etched through the first layer or first sequence of layers down to or into the second layer below. An element of the present invention is that the etching occurs in such a manner that the etching mask is undercut. Then electrically conductive material is introduced in the indentations, with the etching mask forming a shadow mask for introducing the material owing to the undercutting and the yielded projecting edges. The conductive material is introduced only in such a manner respectively to such a height in the indentations that no contact is created between the conductive material and the first layer or first sequence of layers. Subsequently the etching mask is removed. Positioning the etching mask occurs in the process by laying or clamping it over the first layer or first sequence of layers, in such a manner that no additional masking step is required.

According to a second aspect of the present invention (claim 2), the first step is carried out like in the process according to claim 1. However, according to the second aspect of the present invention, etching the indentations is carried out in such a manner that at least one region of the first layer or first sequence of layers obtains negative flanks respectively is undercut. After the etching step, the etching mask can already be removed. Then the electrically conductive material is introduced into the indentations. In this instance, the region with the first layer or first sequence of layers with the negative flanks forms a shadow mask for introducing the material owing to the yielded projecting edges. The conductive material is also only introduced in such a manner respectively to such a height in the indentations that no contact occurs between the conductive material and the first layer or first sequence of layers.

The particularly advantageous aspects of the invented process according to claims 1 and 2 permit realizing contacting the second layer through the first layer without additional masking or isolation, permitting contacting a base layer through the emitter layer of a solar cell.

With this process, any desired pattern, such as grooves or holes and combinations of grooves and holes can be realized in one step.

By using this process, no significant damage occurs to the solar cell and the to-be-treated material is not subject to mechanical stress.

In the invented process of claim 2, for example, photolithographically structured varnish layers can be employed as etching masks. Oxide, nitride or metal layers can also be used as etching masks. Especially advantageous of this process is being able to use shadow masks that are only placed or clamped on thereby obviating an additional masking step.

Introducing the electrically conductive material can occur using processes known in the art, such as for example the processes described in the introduction of the specification in connection with FIG. 1.

An invented solar cell provided with a contact structure according to claim 2 has indentations or openings in the first layer or first sequence of layers extending down to or into the second layer or first sequence of layers. The indentations have at least in the region of the first layer or first sequence of layers oblique flanks whose intermediate spaces increase with depth (negative flanks). In the indentations, the electrically conductive material is introduced only in such a manner respectively in such a height so that there is no contact between the conductive material and the first layer or first sequence of layers. located on the base layer (1). In this process the mask (3) is either undercut (FIGS. 9b and 9d) or the shape of the flanks of the indentations are etched (FIG. 9c) in such a manner that that masking of the emitter (2) is ensured during metallization. Metallization occurs by means of vapor depositing and possibly subsequent galvanic thickening of the metal. As vapor depositing does not occur precisely perpendicular, the emitter region must also be masked in the structure respectively in the indentations like throwing a shadow, which is ensured by the invented structure. For realization of the base contact (9), precipitation or application of the metal only needs to occur to a height inside the indentations at which metallization (9) has no contact to the emitter layer (2) yet, as depicted in the lower parts of FIGS. 9b to 9d. The shown cross section shape of metallization (9) is yielded by the masking.

In this application, the grooves or holes can essentially also be produced wet-chemically. However, the etching rate is then isotropic, i.e. horizontal and vertical is the same, only quite wide structures are realizable which is accompanied by correspondingly large masking of the solar cells or high contact resistance and low current conductivity of the contacts. FIG. 9d shows a form of indentation respectively of the groove such as can be created by means of wet-chemical etching.

Suited etching solutions or materials respectively crystal directions or also suited choice of parameters in plasma etching processes for producing the invented structures can be found in the pertinent literature.

Figure 10:
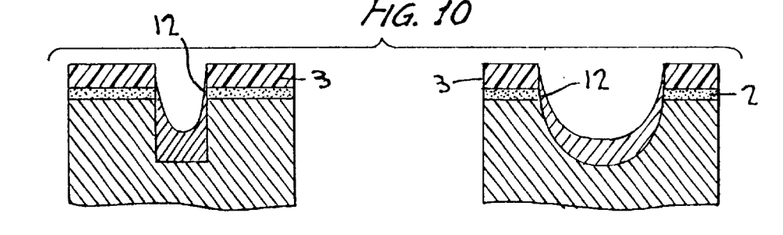
Figure 10         an example of the result of metallizing a structure without using the invented process.

If no invented structure with self-masking effect is employed for contacting and the contacting does not occur according to the invented process of undercutting a mask (3) followed by subsequent metallizing through the same mask there are short-circuits (12) between the emitter (2) and the base contact (9), as shown in FIG. 10. Consequently the solar cell is useless.

Figure 11:
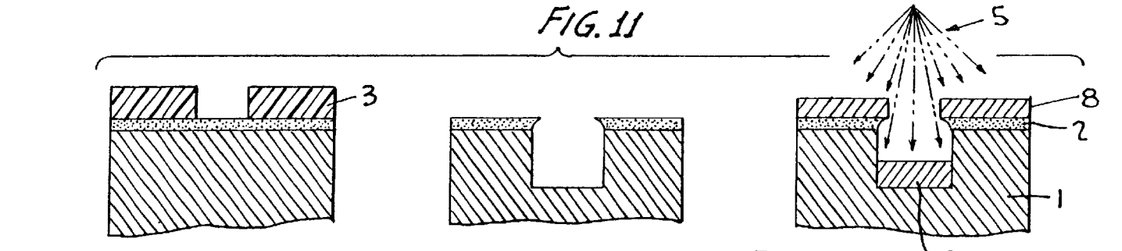
Figure 11         an example of the invented metallization of the emitter and the base in the case of rear-side contacting and
Figure 12         an example of the invented simultaneous metallizing of an one-sided contacting grid.

FIG. 11 shows a preferred embodiment (example 3) of simultaneous self-aligning metallization of the emitter and the base in the case of rear-side contact cells. As in cells with rear-side contacting, the entire rear side can be metallized, the invented grooves or holes permit simultaneous self-aligning contacting of the emitter and the base. Like in the previous example (example 2), the structures are etched through the emitter (2) into the base (1). Decisive is the self-masking of the structure flanks. FIG. 11 shows the undercutting of the regions close to the surface of the emitter layer (2) giving the indentation in the region of the emitter layer oblique flanks, whose spacing increases with depth. Then the mask is removed and full-surface metallization occurs. Metallization on the emitter layer (2) yields the emitter contact (8), metallization in the indentation yields the base contact (9). As explained in connection with example 1, various types of masks can be used for producing the structures. Due to the shape of the grooves or holes with projecting edges of the regions of the emitter layer close to the surface, the metal is precipitated as shown in FIG. 11 in such a manner that short-circuiting between the emitter contact (8) and the base contact (9) is ruled out. With the depicted example the emitter (2) and the base (1) are contacted simultaneously in an advantageous manner using a single mask.

Figure 12:
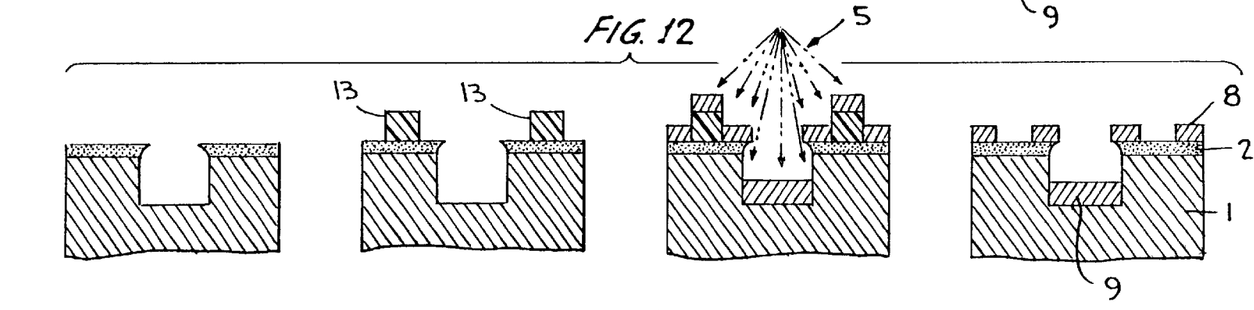

In contrast to the previous example (example 3), the emitter contact (8) can also be executed not full surface, for instance in order to realize an emitter grid. For this purpose, an additional metallization mask (13) is required as shown in FIG. 12. However, metallization of the emitter (2) and the base (1) can still be carried out in one step. After producing indentations according to the aforedescribed example (example 3), the additional mask (13) is placed in order to define the emitter contact. During subsequent full-surface metallizing, the emitter and the base are contacted simultaneously. Then the additional mask is removed. This form of simultaneous metallizing of the emitter and the base is also applicable on the one-sided contacting from the front side. It has the same advantages as the aforedescribed example.

What is claimed is:

1. A process for fabricating contact structures in solar cells, which have at least one first layer or first sequence of layers over a second layer comprising:

positioning an etching mask on said at least one first layer or first sequence of layers, with said etching mask determining the contact structures;

etching indentations through said at least one first layer or first sequence of layers at sites prescribed by said etching mask down to or into said second layer lying therebelow in such a manner that said etching mask is undercut; and introducing an electrically conductive material into said indentations, with said etching mask forming a shadow mask for introducing said electrically conductive material and said conductive material being introduced only in such a manner that no contact occurs between said conductive material and said at least one first layer or first sequence of layers; wherein said positioning of said etching mask occurs by laying or clamping said mask over said at least one first layer or first sequence of layers, with said etching mask being removed after said introducing of said electrically conductive material into said indentations.

2. A process for fabricating contact structures in solar cells which have at least one first layer or first sequence of layers over a second layer, comprising:

- positioning an etching mask on said at least one first layer or first sequence of layers, with said etching mask determining the contact structures;
- etching indentations through said at least one first layer or first sequence of layers at sites prescribed by said etching mask down to or into said second layer lying therebelow; and
- introducing an electrically conductive material into said indentations in such a manner that no contact occurs between said conductive material and said at least one first layer or first sequence of layers;
- wherein at least one region of said at least one first layer or first sequence of layers is undercut obtaining negative flanks, with said at least one region which is undercut and said negative flanks forming a shadow mask for said introducing of said conductive material and said etching mask being removed before said introducing of said conductive material.

3. A process according to claim 2, wherein said at least one region which is undercut with negative flanks is a region close to a surface of said at least one first layer or first sequence of layers.

4. A according to claim 1 or 2, wherein said undercut of said etching mask or said etching of said negative flanks in a region of said at least one first layer or first sequence of layers is provided by selective control of parameters of said etching process and/or by varying etching behavior of the material used for said etching mask and/or said at least one first layer or first sequence of layers.

5. A process according to claim 1 or 2, wherein said conductive material is applied full surface on said at least one first layer or first sequence of layers simultaneously with the introducing thereof into the indentations.

6. A process according to claim 1 or 2, wherein a new mask is applied for defining a contact structure for said at least one first layer or first sequence of layers before said introducing of said conductive material, subsequently said conductive material being simultaneously introduced into said indentations and in said contact structure for said at least one first layer or first sequence of layers, and thereupon said new mask being removed.

7. A process according to claim 1 or 2, wherein said at least one first layer is an emitter layer and said second layer is a base layer of said solar cell.

8. A process according to claim 1 or 2, wherein said etching is plasma etching.

9. A process according to claim 2, wherein said positioning of said etching mask is by laying or clamping said mask over said at least one first layer or first sequence of layers as a shadow mask.

* * * * *

UNITED STATES PATENT AND TRADEMARK OFFICE
CERTIFICATE OF CORRECTION

PATENT NO. : 6,423,567 B1
DATED : July 23, 2002
INVENTOR(S) : Ralf Lüdemann et al.

It is certified that error appears in the above-identified patent and that said Letters Patent is hereby corrected as shown below:

Title page,
Item [86], §371(c) (1), (2), (4) Date of "Jan. 16, 2001" should read -- Nov. 29, 2000 --.

Signed and Sealed this

First Day of April, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,423,567 B1
DATED : July 23, 2002
INVENTOR(S) : Ralf Lüdemann et al.

It is certified that error appears in the above-identified patent and that said Letters Patent is hereby corrected as shown below:

Column 2,
Line 15, following "(1997)," insert -- pp. 392-395, --.
Between lines 39 and 40, insert paragraph as follows: -- The publication by C. M. Chong, et al., Plasma-Grooved, Buried Silicon Solar Cells, Journal of Appl. Phys. 69 (1991), No. 7, pp. 4135-4136, also describes solar cells with buried contacts in the emitter layer, where there is less shading of the surface due to contacting compared to other solar cells. The base is contacted from the rear side of the solar cell via full-surface-applied metallization. Producing the grooves occurs by reactive sputter etching. --.

Column 3,
Delete line 11, starting at "Barcelona" to Column 3, line 62.
Between lines 62 and 63, insert -- to a carrier material. However, many of these substrates are unable to conduct. Therefore, contact to the base cannot occur from the rear side of the substrate. Instead a so-called one-sided grid, comprising two interlocking grids for contacting the base and the emitter respectively has to be employed.

Figure 4a shows an example of the buildup of a thin-layer solar cell with one-sided contacting. The base layer (1) is applied to an insulating substrate (11) . The selective emitter regions respectively layers (2) are embedded in this base layer. Contacting of both the emitter regions and the base occurs via the interlocking emitter grid (8) respectively base grid (9), as the figure shows. The idea of one-sided contacting can be simultaneously used to connect multiple solar cells with one another on a substrate as described in the German patent application P 197 15 138.8.

The same construction applies to rear-side contact cells, an idea for high-efficient solar cells, as shown in figure 4b. Here both contacts and the selective emitter regions (2) are executed on the rear side of the base layer (1) in order to completely eliminate shading the light (10) on the front side. If the contacts are realized as narrow grids (8, 9), the light that reaches the solar cell from the rear side can also contribute to producing current (a so-called "bifacial cell").

The realization of this one-sided contacting has hitherto only been possible using very complicated processes. A so-called selective emitter is produced by means of multiple masks, i.e. the emitter is not made of a homogeneous layer, but rather is made of sub-regions corresponding to the shape of the emitter grid. The fabrication process is shown in figure 5. The surface of the base layer (1) is initially masked (figure 5a). Then the material for producing the emitter regions (2) is diffused (5b) into the surface of the base layer (1) at the sites prescribed by the mask (3).

UNITED STATES PATENT AND TRADEMARK OFFICE
CERTIFICATE OF CORRECTION

PATENT NO. : 6,423,567 B1
DATED : July 23, 2002
INVENTOR(S) : Ralf Lüdemann et al.

It is certified that error appears in the above-identified patent and that said Letters Patent is hereby corrected as shown below:

Column 3 cont'd,
In a subsequent "lift-off" process the mask (3) is removed (figure 5c) yielding the structure having a base (1) and selective emitter regions (2) shown in figure 5d. In this manner the regions belonging to the base (1) are retained on the surface and can be contacted at the surface.

The exact placement of the respective metal contacts on the corresponding emitter region respectively base region is a critical alignment problem and call for additional masks.

DE 3919693 describes a solar cell with a projecting dielectric layer and a process for its fabrication. In the fabrication process, a dielectric layer is applied to the surface of the emitter layer of the solar cell and structured. Then, this dielectric layer is employed as an etching mask in order to etch grooves or indentations through the emitter layer into the base of the solar cell lying therebelow. This etching process is executed in such a manner that the dielectric etching mask is undercut. Then the metal is introduced into the created indentation, with the projecting area of the dielectric layer serving as a shadow mask. The metal is introduced only to a level in the indentations at which no contact to the emitter layer is created. In this manner contacting of the base layer of a solar cell is realized through the emitter layer. In the process of this publication, the dielectric layer is subsequently not removed, but if need be only etched back to the desired thickness at which it fulfills the function of an antireflection coating. As a result of this process, a solar cell with a projecting dielectric layer is yielded, whose base is contacted through the emitter layer via V-shaped indentations.

Therefore, it is the object of the present invention to provide a process for producing contact structures in solar cells as well as solar cells having contact structures, which can be realized in a simple and inexpensive manner.

It is the object of the present invention to provide a process for producing contact structures in solar cells as well as solar cells having contact structures, which can be realized in a simple and inexpensive manner. --

Column 4,
Line 16, following "removed" insert -- Positioning the etching mask occurs in the process by laying or clamping it over the first layer or first sequence of layers. --.
Line 44, "claims 1 and 2" should read -- claim 2 --.

UNITED STATES PATENT AND TRADEMARK OFFICE
CERTIFICATE OF CORRECTION

PATENT NO.     : 6,423,567 B1
DATED          : July 23, 2002
INVENTOR(S)    : Ralf Lüdemann et al.

It is certified that error appears in the above-identified patent and that said Letters Patent is hereby corrected as shown below:

Column 6,
Delete line 2, from "The" through line 67.
Line 2, following "to-be-", insert -- etched material and its crystal orient ation and therefore also for inexpensive multicrystalline material.

Damage to the treated materials, always possible with a plasma process, is extremely critical for solar cells. In contrast to most other semiconductor components, in solar cells stray power should be kept to a minimum. This means that recombination of the charge carriers has to be largely suppressed for the electric contacts to reach as many charge carriers as possible. In order to ensure this, in the present case extremely low-damage plasma-supported etching processes which have no negative influence on the solar cells are used. This is achieved by small ion energies and a combination of etching gases adapted to the respective process.

The fact that plasma etching processes are dry-chemical processes broadens the application area beyond wet-chemical processes. For example, the use of a plasma etching process for fabrication of the invented contact structures advantageously permits treating thinlayer solar cells on porous substrate materials. As plasma etching processes are dry processes, the to-be-treated material does not come in contact with liquids. Shadow masks can also be employed as etching masks which is much more cost effective than the photolithographic masks required for wet chemistry.

The present invention is made more apparent in the following using preferred embodiments with reference to the accompanying figures, showing in

| | |
|---|---|
| Figure 1 | examples of metallizing processes for solar cells according to the state of the art; |
| Figure 2 | a diagram of a simple solar cell according to the state of the art; |
| Figure 3 | examples of a maskless metallizing of saw teeth structures according to the state of the art; |
| Figure 4 | examples of a one-sided contacting of a thin-layer solar cell (a) and a rear-side contact cell (b) according to the state of the art; |
| Figure 5 | an example of steps for fabricating a selective emitter according to the state of the art; |
| Figure 6 | examples of the preferred embodiment of invented self masking contact structures; |
| Figure 7 | examples of self-aligning metallizing on the basis of self-masking by undercutting the etching mask according to one aspect of the present invention; |

UNITED STATES PATENT AND TRADEMARK OFFICE
CERTIFICATE OF CORRECTION

PATENT NO. : 6,423,567 B1
DATED : July 23, 2002
INVENTOR(S) : Ralf Lüdemann et al.

It is certified that error appears in the above-identified patent and that said Letters Patent is hereby corrected as shown below:

Column 6 cont'd,
Figure 8          an example of steps of the self-aligning fabrication of buried contacts according to the present invention.

The examples of processes for metallizing, contacting and designing solar cells according to the state of the art shown in figures 1 to 5 have already been explained in the introduction to the specification.

Figure 6 shows examples of contact structures produced by undercutting respectively by etching flanks in a region of the emitter layer (2) located on the base layer (1) of a solar cell. All the depicted structures show a self-masking effect during metal vapor depositing so that after precipitation of the metal on the surface of the emitter layer of the emitter contact (8) and in the indentations of the base contact (9) occurs in the diagrammatically depicted manner. The indentations are only filled or precipitation of the metal occurs only to the extent that no contact occurs between the base contact (9) and the emitter layer (2). The flanks of the indentations depicted in the figure (pictures from left to right) have straight negative flanks, vertical flanks in the base layer with a negative region in the emitter layer, any desired flank shape with a negative region in the emitter layer and after isotropic etching a flank shape with negative region in the emitter layer. The depicted flank shapes can be created, for example, by different etching behavior in the emitter and the base.

Figure 7 shows examples of self-masking by undercutting the etching mask (3) according to one aspect of the present invention. The meaning of the reference numbers correspond to those of figure 6. In this undercutting the etching mask (3) itself was not attacked. The exact shape of the indentations did not play any role, i.e, no negative flanks in the emitter layer (2) are required like in figure 6. The right picture shows a scanning electron microscope (REM) photo of a structure realized with the process.

UNITED STATES PATENT AND TRADEMARK OFFICE
CERTIFICATE OF CORRECTION

PATENT NO. : 6,423,567 B1
DATED : July 23, 2002
INVENTOR(S) : Ralf Lüdemann et al.

It is certified that error appears in the above-identified patent and that said Letters Patent is hereby corrected as shown below:

<u>Column 6 cont'd,</u>
Fabrication of this structure may, for example, be carried out in an ECR reactor in downstream mode. If an etching gas such as sulfur hexafluoride $SF_6$ is used with a gas flow of 30 sccm, at a pressure of 3 Pa, a microwave output of 400W, a sample temperature of 10°C, a sample-plasma distance of 200mm and an etching period of 15 min. can, for instance, reach a groove depth of 15 $\mu$m. If additional high-frequency (RIE) power of 20 W is employed, the grooves can be realized narrower and deeper in the same time.

A preferred embodiment (example 1) of the invented process represents a self-aligning metallization of buried contacts in a solar cell. The process represents an improvement of the grooves produced by means of lasers or by sawing with regard to the aspect relationship and damage of a "buried contact cell".

If structuring of the surface occurs prior to forming the emitter, an emitter contact can be realized. If the structuring occurs on the base region of the solar cell, a base contact is realized.

Figure 8A:
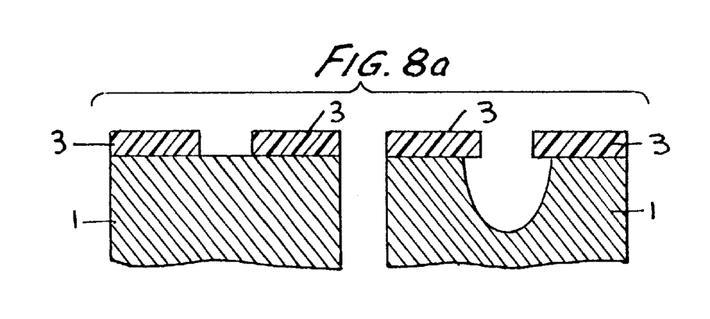
Figure 8B:
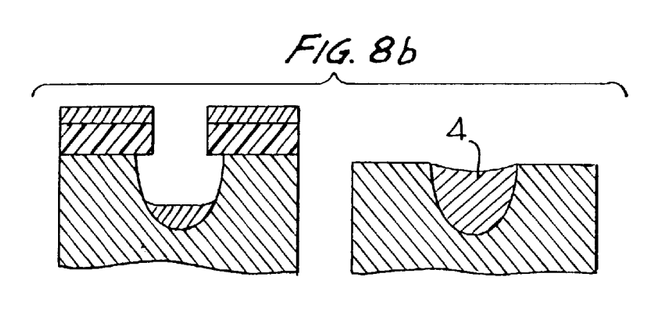

A mask (3) is employed to create the grooves (or holes). This mask can be either a photolithographically created varnish mask or a shadow mask. Suitably opened layers (oxide, nitride, metals, etc.) already present on the solar cell (1) can also be used as a mask. A very narrow, deep structure can be produced without damaging the masks by plasma etching (e.g. RIE or microwave-aided RIE processes such as ECR-RIE), as depicted in figure 8a. Figure 8a shows the undercutting of the mask (3). The mask is also employed for metallization and is not removed until after metallization in a "lift-off,, process. After removal of the mask, a metallized groove (4) is yielded (figure 8b), thereby obviating alignment of the metallization mask on the structure. Metallization can either occur by means of vapor depositing or by means of filling the structures with metal paste. This can occur by means of squeegeeing or full-surface pressing.

A very narrow, deep structure can be produced without damaging the masks by plasma etching (e.g. RIE or microwave-aided RIE processes such as ECR-RIE), as depicted in figure 8a. Figure 8a shows the undercutting of the mask (3). The mask is also employed for metallization and is not removed until after metallization. After removal of the mask, a metallized groove (4) is yielded (figure 8b), thereby obviating alignment of the metallization mask on the structure. Metallization can either occur by means of vapor depositing or by means of filling the structures with metal paste. This can occur by means of squeegeeing or full-surface pressing.

UNITED STATES PATENT AND TRADEMARK OFFICE
CERTIFICATE OF CORRECTION

PATENT NO.    : 6,423,567 B1
DATED         : July 23, 2002
INVENTOR(S)   : Ralf Lüdemann et al.

It is certified that error appears in the above-identified patent and that said Letters Patent is hereby corrected as shown below:

Column 6 con'td,
Another invented embodiment (example 2) permits for the first time contacting the base of a solar cell through a homogenous emitter, i.e. through an emitter layer covering the entire surface, as shown in figure 9. This corresponds to self-alignment contacting of the base in one-sided contacting. A single mask can be used for fabrication of the invented grooves or holes and the subsequent metallization. Both the complicated fabrication of a selective emitter and the alignment of the metallization mask on the structure are obviated. Thus simple solar cell contacting from one side is available which can be used for thin-layer cells on insulating substrate as well as for rear-side contact cells.

Figure 9A:
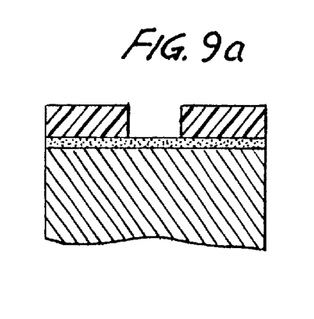
Figure 9          an example of the invented contacting of the base of a solar cell through a homogeneous emitter layer.
Figure 9B:
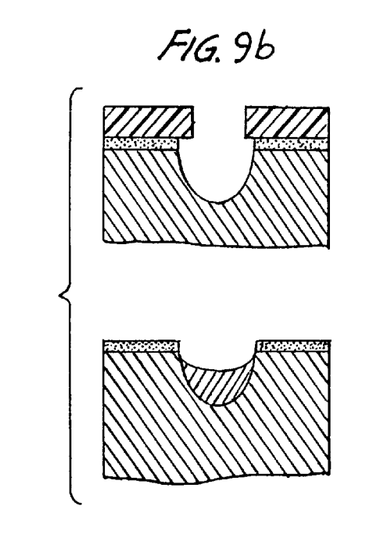
Figure 9C:
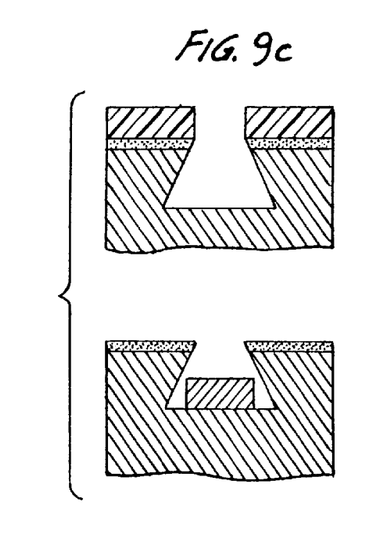
Figure 9D:
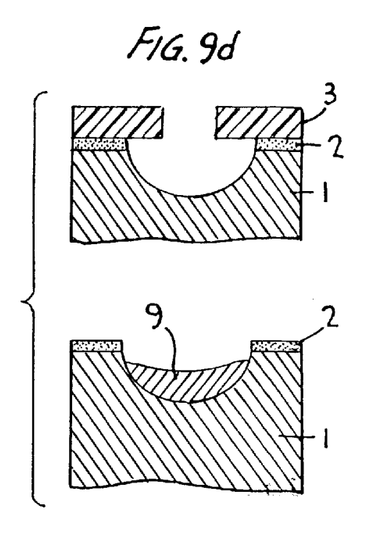

The grooves or holes are produced in the manner described in the preceding example (example 1) by using a mask (3) on the emitter layer (2) (figure 9a). The emitter layer (2) is --.

Column 7,
Delete line 1 through "first sequence of layers." at line 37.

Column 9,
Line 27, claim 4, following "A", insert -- process --.

Signed and Sealed this

Twelfth Day of August, 2003

JAMES E. ROGAN
*Director of the United States Patent and Trademark Office*